(12) United States Patent
Koh

(10) Patent No.: US 10,714,162 B2
(45) Date of Patent: Jul. 14, 2020

(54) MEMORY SYSTEM AND OPERATING METHOD OF THE MEMORY SYSTEM

(71) Applicant: SK hynix Inc., Gyeonggi-do (KR)

(72) Inventor: Young-Sik Koh, Gyeonggi-do (KR)

(73) Assignee: SK hynix Inc., Gyeonggi-do (JP)

( * ) Notice: Subject to any disclaimer, the term of this patent is extended or adjusted under 35 U.S.C. 154(b) by 0 days.

(21) Appl. No.: 16/215,981

(22) Filed: Dec. 11, 2018

(65) Prior Publication Data

US 2019/0348095 A1  Nov. 14, 2019

(30) Foreign Application Priority Data

May 11, 2018 (KR) .................. 10-2018-0054239

(51) Int. Cl.
*G11C 8/00* (2006.01)
*G11C 8/18* (2006.01)
*G11C 7/22* (2006.01)
*G11C 11/4076* (2006.01)
(Continued)

(52) U.S. Cl.
CPC .............. *G11C 8/18* (2013.01); *G11C 7/1072* (2013.01); *G11C 7/222* (2013.01); *G11C 11/4076* (2013.01); *G11C 16/32* (2013.01); *G11C 2207/2272* (2013.01)

(58) Field of Classification Search
CPC ....... G11C 8/18; G11C 7/1072; G11C 7/2222; G11C 11/4076; G11C 16/32; G11C 2207/2272
See application file for complete search history.

(56) References Cited

U.S. PATENT DOCUMENTS 9,025,384 B2 * 5/2015 Lee .................. G11C 16/10
365/185.17
2004/0193834 A1 * 9/2004 Emberling .......... G06F 13/1621
711/213

(Continued)

FOREIGN PATENT DOCUMENTS

KR   1020100099892   9/2010
KR   1020160041717   4/2016

OTHER PUBLICATIONS

Kim, H. J. et al., 1GB/s 2Tb NAND Flash Multi-Chip Package with Frequency-Boosting Interface Chip, ISSCC 2015 Session 7 Non-Volatile Memory Solutions 7.6, Feb. 24, 2015, pp. 138-139, IEEE International Solid-State Circuits Conference.

*Primary Examiner* — Pho M Luu
(74) *Attorney, Agent, or Firm* — IP & T Group LLP

(57) ABSTRACT

A memory system includes: a memory device suitable for storing a data; a controller suitable for controlling an operation of the memory device based on a control signal; and an interface device includes a signal transfer device suitable for transferring the control signal from the controller to the memory device and transferring the data between the memory device and the controller; and a signal control device suitable for controlling an operation of the signal transfer device in response to an interface control signal included in the control signal, wherein the interface control signal includes a blocking command for stopping an operation of the signal transfer device, a correction command for correcting a duty cycle of the control signal, and an unblocking command for resuming the operation in response to the corrected control signal, of the signal transfer device.

20 Claims, 19 Drawing Sheets

(51) Int. Cl.
*G11C 16/32* (2006.01)
*G11C 7/10* (2006.01)

(56) References Cited

U.S. PATENT DOCUMENTS

2008/0080226 A1* 4/2008 Mikolajick .......... G11C 7/1006
  365/148
2018/0373313 A1* 12/2018 Hasbun ................ G06F 1/3275

* cited by examiner

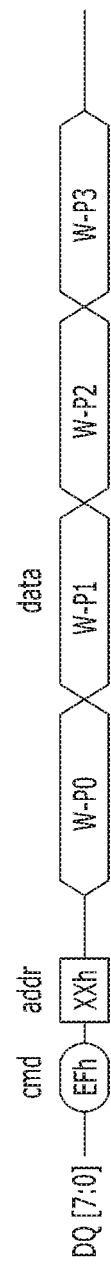

MEMORY SYSTEM AND OPERATING METHOD OF THE MEMORY SYSTEM

CROSS-REFERENCE TO RELATED APPLICATION(S)

The present application claims priority of Korean Patent Application No. 10-2018-0054239, filed on May 11, 2018, the entire disclosure of which is incorporated herein by reference in its entirety.

BACKGROUND

1. Field

Various embodiments of the present invention generally relate to a memory system. Particularly, the embodiments relate to a memory system for processing data with a memory device, and a method for operating the memory system.

2. Description of the Related Art

The computer environment paradigm has been shifting to ubiquitous computing, which enables computer systems to be used anytime and anywhere. As a result, use of portable electronic devices such as mobile phones, digital cameras, and notebook computers has rapidly increased. These portable electronic devices generally use a memory system having one or more memory devices for storing data. A memory system in such device may be used as a main memory device or an auxiliary memory device.

Such memory systems provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Embodiments of the present invention are directed to a memory system capable of accurately correcting a clock of a memory system, and a method of operating the memory system.

In accordance with an embodiment of the present invention, a memory system includes: a memory device suitable for storing a data; a controller suitable for controlling an operation of the memory device based on a control signal; and an interface device including a signal transfer device suitable for transferring the control signal from the controller to the memory device and transferring the data between the memory device and the controller, and a signal control device suitable for controlling an operation of the signal transfer device in response to an interface control signal which is included in the control signal, wherein the interface control signal includes a blocking command for stopping an operation of the signal transfer device, a correction command for correcting a duty cycle of the control signal, and an unblocking command for resuming the operation in response to the corrected control signal, of the signal transfer device.

In accordance with another embodiment of the present invention, a method for operating a memory system including a memory device that stores a data includes: transferring a control signal to the memory device; transferring the data between the memory device and a controller suitable for controlling the memory device; and controlling the transferring of the control signal to the memory device and the transferring of the data between the memory device and the controller in response to an interface control signal included in the control signal, wherein the controlling of the transferring of the control signal includes: stopping the transferring of the control signal to the memory device and the transferring of the data between the memory device and the controller in response to a blocking command; correcting a duty cycle of the control signal in is response to a correction command; and resuming the transferring of the corrected control signal to the memory device and the transferring of the data between the memory device and the controller in response to an unblocking command.

The blocking command and the unblocking command may be set feature commands.

The controlling of the transferring of the control signal may further include controlling an operation of the signal transfer device by changing a stored value of the operation control register in response to the interface control signal.

The stopping of the transferring of the control signal may include deactivating an access to the memory device in response to the blocking command.

The deactivating of the access to the memory device may include deactivating a chip enable signal for the memory device in response to the blocking command.

The correcting of the duty cycle of the clock may include: measuring one cycle time of a clock signal of the controller in response to the correction command; and calculating a ½ cycle time and a ¼ cycle time of the clock signal based on the first cycle time.

The correcting of the duty cycle of the clock may include generating a first signal and a second signal which have waveforms that are the same as a waveform of the clock signal and which have phases are 180 degrees different from each other based on at least one between the ½ cycle time and the ¼ cycle time and the clock signal.

The correcting of the duty cycle of the clock may include correcting the duty cycle by outputting a logic high level at a rising edge of the first signal and outputting a logic low level at a rising edge of the second signal.

The correcting of the duty cycle of the clock may include receiving a read command as the correction command and receiving a read enable signal as the clock signal.

In accordance with yet another embodiment of the present invention, a memory system includes: a memory device suitable for storing a data; a controller suitable for controlling an operation of the memory device based on a control signal; and an interface device including a signal transfer device suitable for transferring the control signal from the controller to the memory device and transferring the data between the memory device and the controller, and a signal control device suitable for controlling an operation of the signal transfer device in response to an interface control signal included in the control signal, wherein the interface control signal includes a blocking command, a correction command, and an unblocking command, and wherein the signal control device stops the operation of the signal transfer device in response to the blocking command, corrects a duty cycle of the control signal in response to the correction command, and resumes the operation in response to the corrected control signal, of the signal transfer device in response to the unblocking command.

In accordance with still another embodiment of the present invention, a method for operating a memory system including a memory device that stores a data; a controller that controls an operation of the memory device based on a control signal; and an interface device including a signal transfer device suitable for transferring the control signal from the controller to the memory device and transferring the data between the memory device and the controller and a signal control device for controlling an operation of the signal transfer device in response to an interface control signal included in the control signal, where the interface control signal includes a blocking command, a correction command, and an unblocking command includes: stopping an operation of the signal transfer device in response to the blocking command; correcting a duty cycle of the control signal in response to the correction command; and resuming the operation in response to the corrected control signal, of the signal transfer device in response to the unblocking command.

The blocking command and the unblocking command may be set feature commands.

The method may further include controlling the operation of the signal transfer device by changing a stored value of the operation control register in response to the interface control signal.

The stopping of the operation of the signal transfer device may include deactivating an access to the memory device in response to the blocking command.

The deactivating of the access to the memory device may include deactivating a chip enable signal for the memory device in response to the blocking command.

The correcting of the duty cycle of the clock may include: measuring one cycle time of a clock signal of the controller in response to the correction command; and calculating a ½ cycle time and a ¼ cycle time of the clock signal based on the first cycle time.

The correcting of the duty cycle of the clock may include: generating a first signal and a second signal which have waveforms that are the same as a waveform of the clock signal and which have phases that are 180 degrees different from each other based on at least one between the ½ cycle time and the ¼ cycle time and the clock signal; and correcting the duty cycle by outputting a logic high level at a rising edge of the first signal and outputting a logic low level at a rising edge of the second signal.

The correcting of the duty cycle of the clock may include receiving a read command as the correction command and receiving a read enable signal as the clock signal.

In accordance with still another embodiment of the present invention, a memory system includes: a controller suitable for providing first to third commands and data; an interface device suitable for: generating operation signals and correcting a duty cycle of the operation signals in response to the first command; deactivating a channel coupled thereto in response to the second command; and activating the channel and providing the corrected operation signals and the data through the channel in response to the third command; and a memory device coupled to the channel and suitable for performing an operation in response to the corrected operation signals and the data.

BRIEF DESCRIPTION OF THE DRAWINGS

FIG. 9B is a timing diagram illustrating a set feature command in accordance with the embodiment of the present invention.

DETAILED DESCRIPTION

Figure 1:
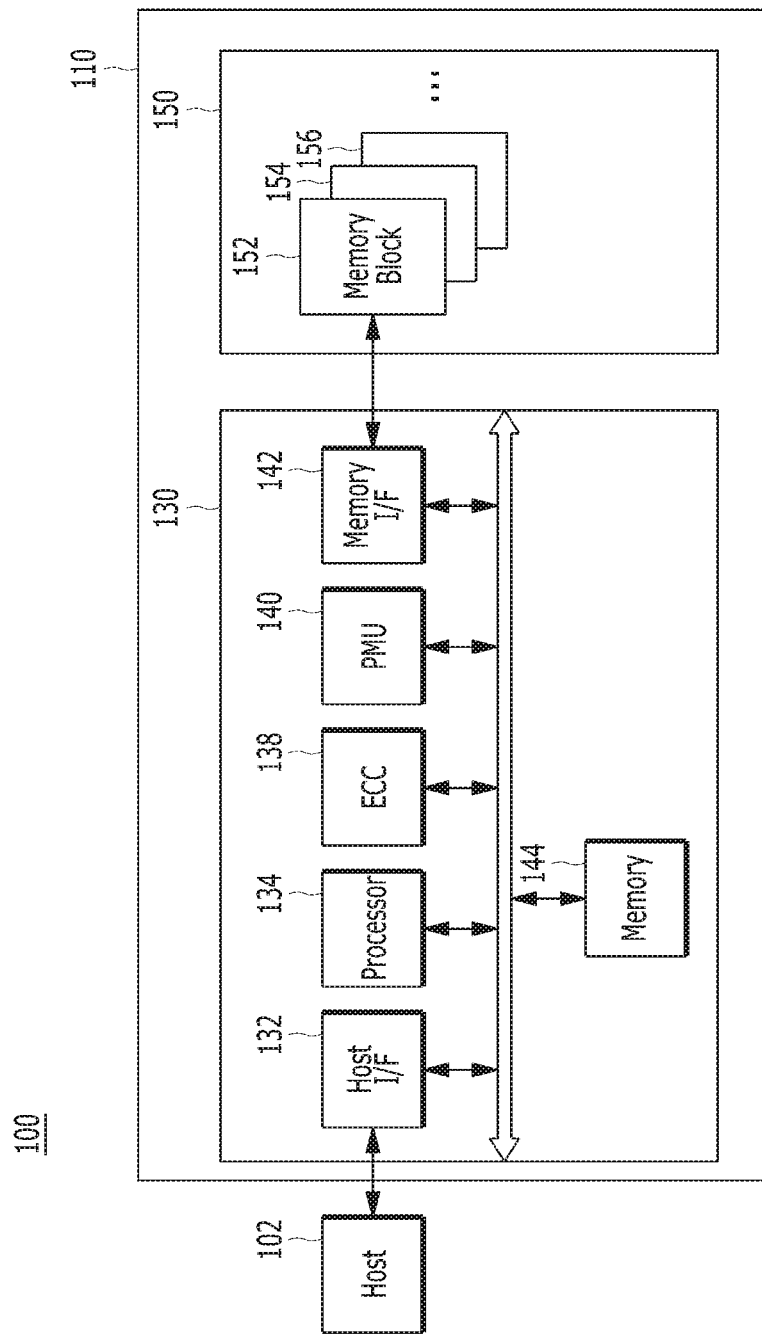
FIG. 1 is a block diagram illustrating a data processing system in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

Hereinafter, the various embodiments of the present invention will be described in detail with reference to the attached drawings.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, game machine, TV, and projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the. The SD card may include a mini-SD card and micro-SD card.

The memory system 110 may be embodied by various types of storage devices. Examples of such storage devices may include, but are not limited to, volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even when power is not supplied or interrupted. The memory device 150 may store data provided from the host 102 through a write operation, and provide data stored therein to the host 102 through a read operation. The memory device 150 may include a plurality of memory blocks 152, 154, 156 . . . (hereinafter, referred to as "memory blocks 152 to 156") each of which may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of these elements and features are omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a memory I/F 142 such as a NAND flash controller (NFC), and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include all circuits, modules, systems or devices for error correction.

The PMU 140 may provide and manage power of the controller 130.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a Central Processing Unit (CPU).

For example, the controller 130 may perform an operation requested by the host 102 in the memory device 150 through the processor 134, which is realized as a microprocessor or a CPU. In other words, the controller 130 may perform a command operation corresponding to a command received from the host 102, or source other than the host 102. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation on the memory device 150 through the processor 134, which is realized as a microprocessor or a CPU. The background operation performed on the memory device 150 may include an operation of copying and processing data stored in some memory blocks among the memory blocks 152 to 156 of the memory device 150 into other memory blocks, e.g., a garbage collection (GC) operation, an operation of swapping between the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
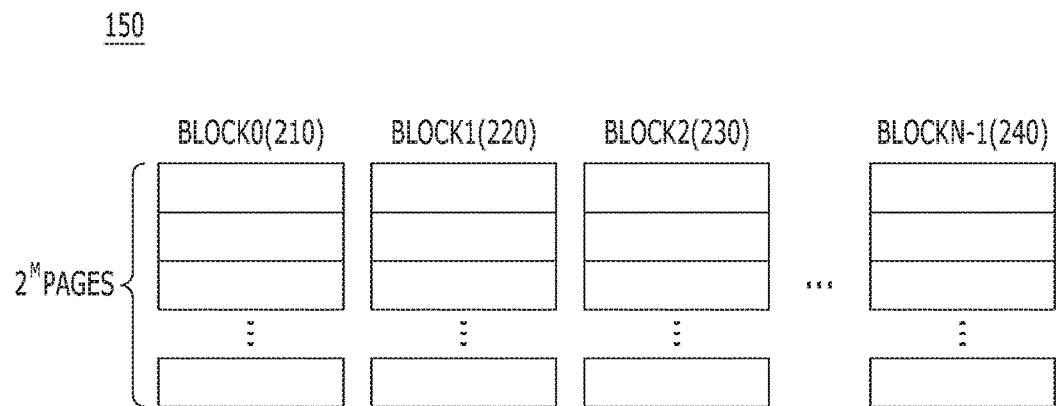
FIG. 2 is a schematic diagram illustrating an exemplary configuration of a memory device employed in a memory system of FIG. 1.
Figure 3:
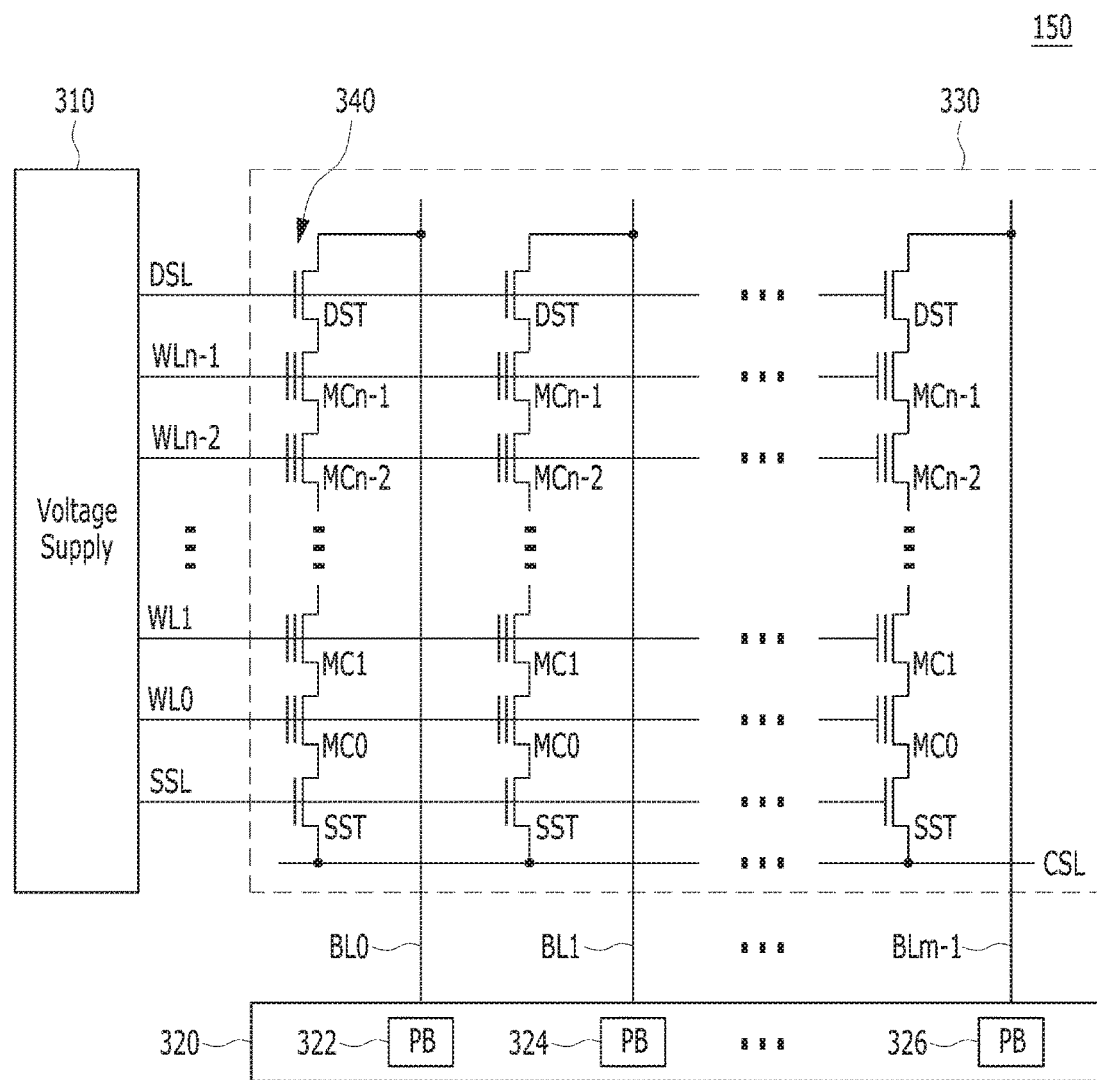
FIG. 3 is a circuit diagram illustrating an exemplary configuration of a memory cell array of a memory block in a memory device shown in FIG. 1.
Figure 4:
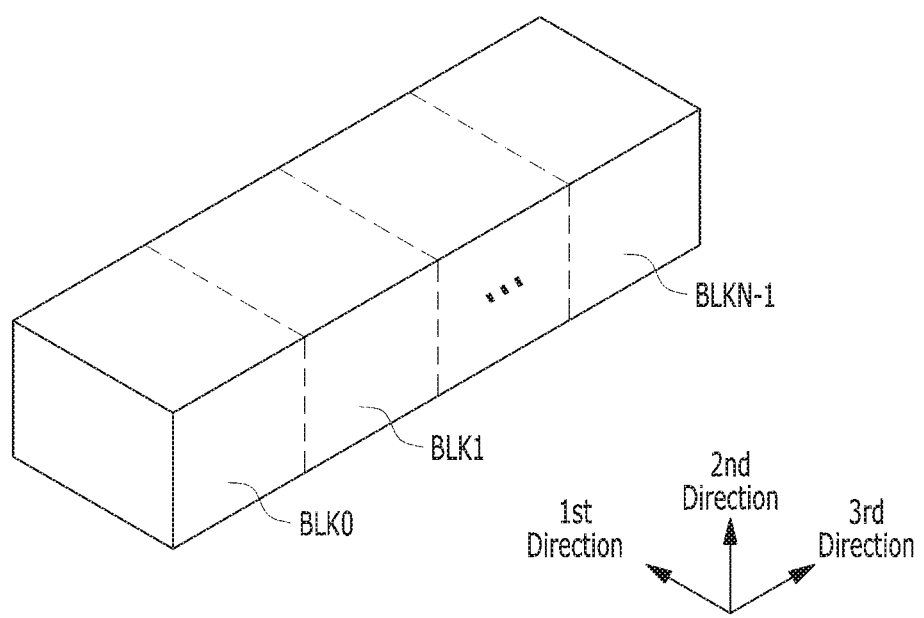
FIG. 4 is a schematic diagram illustrating an exemplary three-dimensional (3D) structure of the memory device of FIG. 2.

FIG. 2 is a schematic diagram illustrating the memory device 150, FIG. 3 is a circuit diagram illustrating an exemplary configuration of a memory cell array of a memory block in the memory device 150, and FIG. 4 is a schematic diagram illustrating an exemplary 3D structure of the memory device 150.

Referring to FIG. 2, the memory device 150 may include a plurality of memory blocks 0 to N-1, e.g., a memory block 0 BLOCK0(210), a memory block 1 BLOCK1 (220), a memory block 2 BLOCK2 (230), and a memory block N-1 BLOCKN-1 (240). Each of the memory blocks BLOCK0 to BLOCKN-1 may include a plurality of pages, for example $2^M$ pages, the number of which may vary according to circuit design. For example, in some applications, each of the memory blocks may include M pages. Each of the pages may include a plurality of memory cells that are coupled to a plurality of word lines WL.

Also, the memory device 150 may include a plurality of memory blocks, which may include a single level cell (SLC) memory block storing 1-bit data and/or a multi-level cell (MLC) memory block storing 2-bit data. The SLC memory blocks may include a plurality of pages that are realized by memory cells storing one-bit data in one memory cell. The SLC memory blocks may have high speed data operation performance and high durability. On the other hand, the MLC memory blocks may include a plurality of pages that are realized by memory cells storing multi-bit data, e.g., data of two or more bits, in one memory cell. The MLC memory blocks may have a greater data storage space than the SLC memory blocks. In other words, the MLC memory blocks may be highly integrated. Particularly, the memory device 150 may include not only the MLC memory blocks, each of which includes a plurality of pages that are realized by memory cells capable of storing two-bit data in one memory cell, but also triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or multiple level cell memory blocks each of which includes a plurality of pages that are realized by memory cells capable of storing five or more-bit data in one memory cell, and so forth.

In accordance with an embodiment of the present invention, the memory device 150 is described as a non-volatile memory, such as a flash memory, e.g., a NAND flash memory. However, the memory device 150 may be realized as any memory among a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

The memory blocks BLOCK0 to BLOCKN-1 may store the data transferred from the host 102 through a program operation, and transfer data stored therein to the host 102 through a read operation.

Referring to FIG. 3, a memory block 330 may include a is plurality of cell strings 340 coupled to a plurality of corresponding bit lines BL0 to BLm-1. The memory block 330 may correspond to any of the plurality of memory blocks 152 to 156 included in the memory device 150 of the memory system 110 shown in FIG. 1. The cell string 340 of each column may include one or more drain select transistors DST and one or more source select transistors SST. Between the drain and select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Referring to FIG. 4, the memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1. The memory blocks BLK0 to BLKN-1 may correspond to the memory blocks 152 to 156 shown in FIG. and the memory blocks BLOCK0 to BLOCKN-1 shown in FIG. 2. Each of the memory blocks BLK0 to BLKN-1 may be realized in a 3D structure (or vertical structure). For example, the memory blocks BLK0 to BLKN-1 may be a three-dimensional structure with dimensions extending in first to third directions, e.g., an x-axis direction, a y-axis direction, and a z-axis direction.

Although not illustrated in FIG. 4, each memory block BLK0 to BLKN-1 which may correspond to any one memory block among the memory blocks shown in FIGS. 1 to 3 of the memory device 150 may include a plurality of NAND strings NS that are extended in the second direction, and a plurality of NAND strings NS that are extended in the first direction and the third direction. Each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block BLK0 to BLKN-1 which may correspond to any one memory block among the memory blocks shown in FIGS. 1 to 3 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Memory cells MC may be provided between the string selection transistor SST and the ground selection transistor GST of each NAND string NS. In other words, a plurality of memory cells may be realized in each memory block 330 of the memory blocks 152 to 156 of the memory device 150.

Hereinafter, a data processing operation of a memory device, particularly, a data processing operation performed when a plurality of command operations corresponding to a plurality of commands are performed, in a memory system in accordance with an embodiment of the present invention is described in detail with reference to FIGS. 5 to 13.

Figure 5:
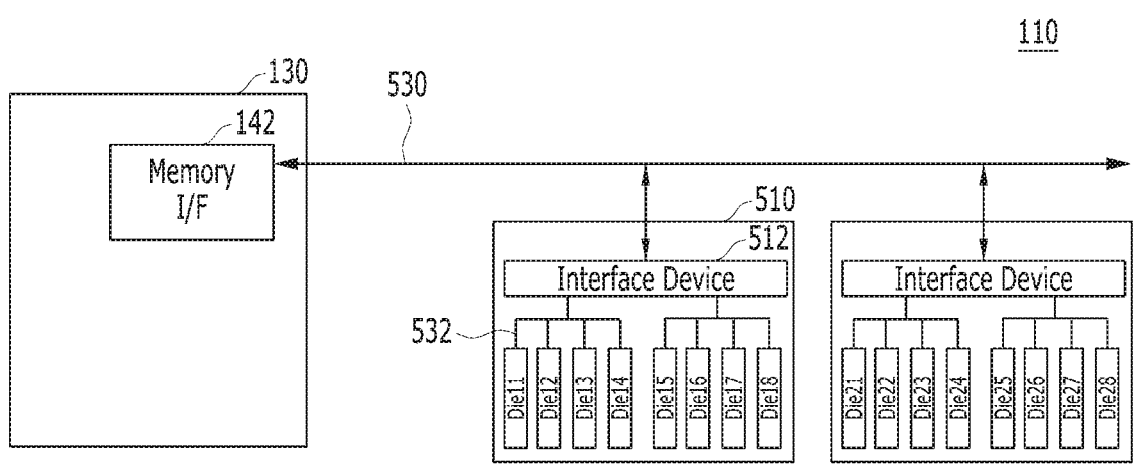
FIG. 5 is a block diagram illustrating an example of a memory system including an interface device.

FIG. 5 is a block diagram illustrating an example of the memory system 110 including an interface device 512.

The memory system 110 may include a plurality of memory devices 150 to meet the demands for increasing capacity of the memory system 110. Each memory dies Die 11 to Die 28 shown in FIG. 5 may correspond to the memory device 150 of FIG. 1. A predetermined number of the memory devices 150 may be packaged into a memory package 510 and included in the memory system 110.

When the loading capacitance of the memory package 510 including a plurality of the memory devices 150 increases, the speed of the memory system 110 may be degraded due to Inter-Symbol Interference (ISI). To improve this problem, the memory package 510 may include an interface device 512 (ISSCC 2015/SESSION 7/NON-VOLATILE MEMORY SOLUTIONS/7.6 1 GB/s 2 Tb NAND Flash Multi-Chip Package with Frequency-Boosting Interface Chip).

The interface device 512 may perform communication between the controller 130 and the memory dies Die 11 to Die 28. The memory package 510 may include an internal channel 532 that couples the interface device 512 to the memory devices 150. FIG. 5 illustrates the memory package 510 that includes two internal channels 532. In this case, the effective loading capacitance of the memory package 510 may be reduced by half, which may improve the speed of the memory system 110.

Figure 6:
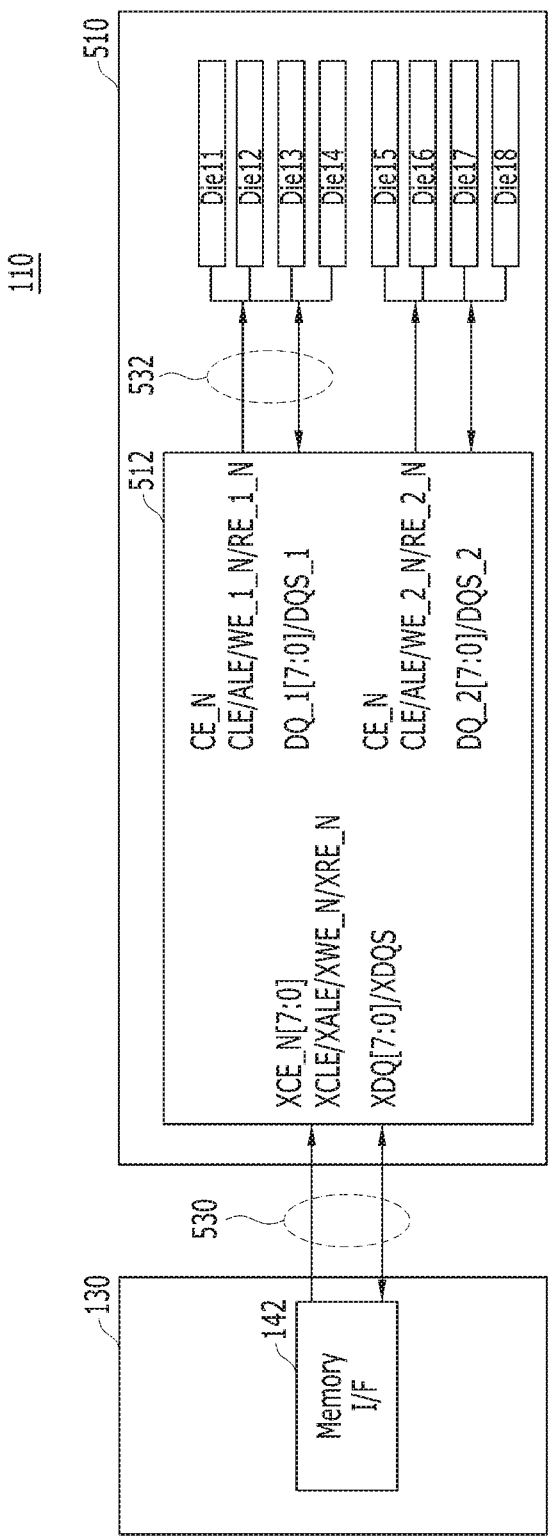
FIG. 6 is a block diagram illustrating an example of a controller and a memory device that communicates with each other through an interface device in a memory system.

FIG. 6 is a block diagram illustrating an example of the controller 130 and the memory device 150 that communicates with each other through the interface device 512 in the memory system 110.

When the controller 130 controls a write operation of the memory die Die 11 in response to a write command transferred from a host (e.g., the host 102 shown in FIG. 1), the interface device 512 may receive a chip enable signal XCE_N[7:0], a command enable signal XCLE, an address enable signal XALE, a write enable signal XWE_N, and a data strobe signal XDQS as control signals, and a data signal XDQ[7:0] as a data signal. The interface device 512 may output an internal chip enable signal CE_N, an internal command enable signal CLE, an internal address enable signal ALE, an internal write enable signal WE_1_N, an internal data signal DQ_N[7:0], an internal data strobe signal DQS_N to the memory die Die 11 corresponding to the chip enable signal XCE_N[7:0] through the internal channel 532 in response to the received control signal.

When the controller controls a read operation of the memory die Die 11 in response to a read command transferred from the host, the interface device may receive a chip enable signal XCE_N[7:0], a command enable signal XCLE, an address enable signal XALE, a read enable signal XRE_N as control signals. The interface device 512 may output an internal chip enable signal CE_N, an internal command enable signal CLE, an internal address enable signal ALE, an internal read enable signal RE_1_N to the memory die Die 11 corresponding to the chip enable signal XCE_N[7:0] through the internal channel 532 in response to the received control signal.

As described above, the effective loading capacitance may be reduced so that the memory system 110 may operate at a high frequency by transferring a control signal from the controller 130 to the interface device 512 of the memory package 510 and transferring an internal signal from the interface device 512 to the memory device 150 based on the received control signal. Meanwhile, as a high-speed operation through the interface device 512 becomes possible, the need for duty cycle correction is increased.

Figure 7:
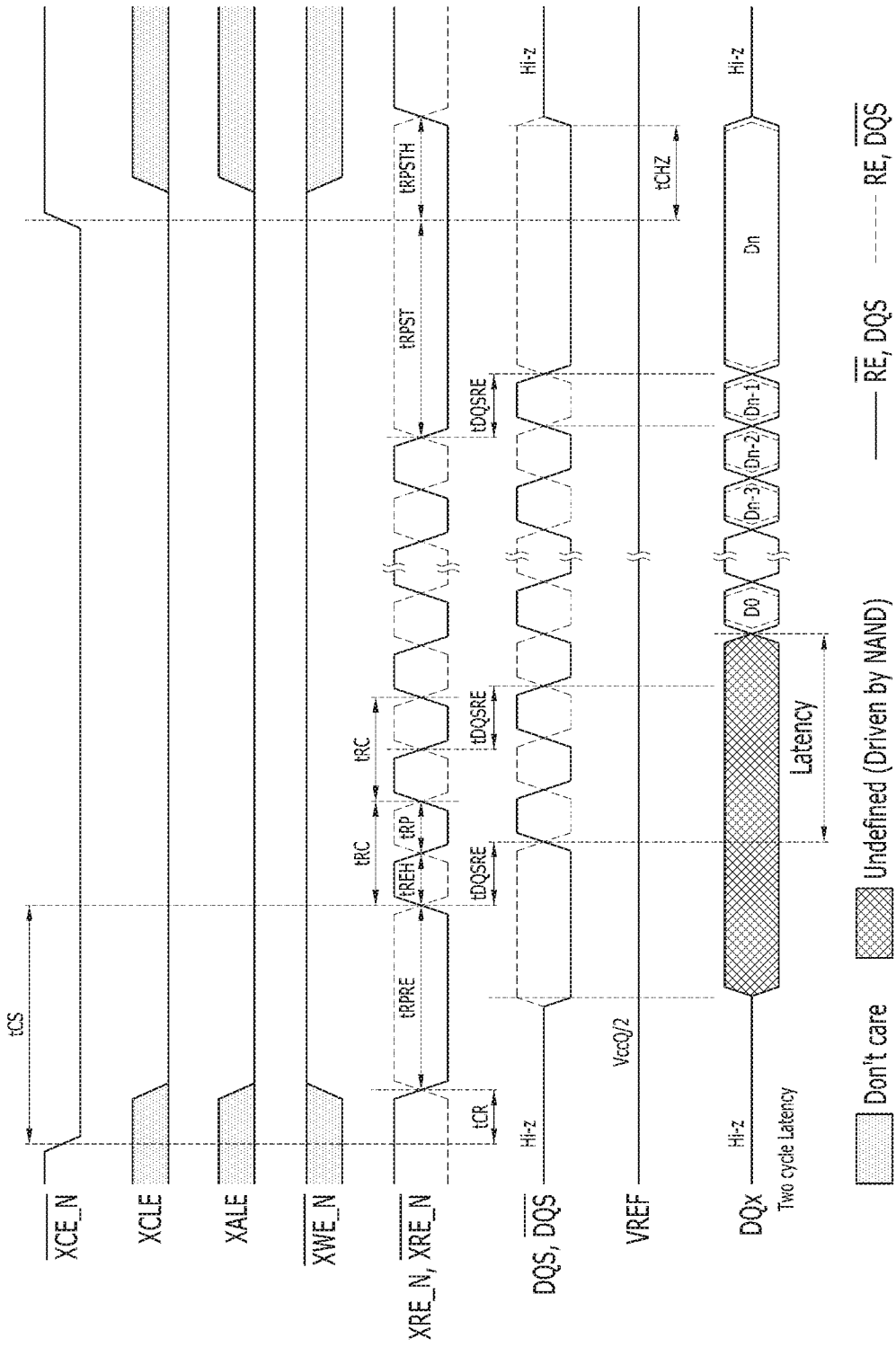
FIG. 7 is a timing diagram illustrating an example of a method for correcting a duty cycle in a memory device.

FIG. 7 is a timing diagram illustrating an example of a method for correcting a duty cycle in the memory device 150.

When a read command is received from the host 102, the controller 130 may generate a chip enable signal XCE_N, a command enable signal XCLE, an address enable signal XALE, and a read enable signal XRE_N. The memory device 150 corresponding to the memory dies Die 11 to Die 28 may perform a read operation in response to the signals and generate a data strobe signal DQS based on the read enable signal RE. The memory device 150 may output a data signal DQ to the controller 130 in response to the data strobe signal DQS.

Meanwhile, when the duty cycle of the read enable signal RE is not approximately 50%, the duty cycle of the data strobe signal DQS generated based on the read enable signal RE may not be approximately 50%. Further, the data signal DQ may be outputted in both high and low sections of the data strobe signal DQS in the memory system 110 operating at a high speed. Therefore, the duty cycle of the data signal DQ outputted in response to the data strobe signal DQS may not be approximately 50%. Since the time section during which the data signal DQ is enabled is short in the memory system 110 operating at a high speed, it may be necessary to broaden a data valid window by accurately matching the ratio of the high section and the low section, for example, to exactly 50%.

Meanwhile, according to an embodiment, the memory device 150 may not output a valid data signal immediately after the data strobe signal DQS is generated, but instead output the valid data signal after a latency of predetermined cycles.

According to the prior art (Korean Patent Publication No. 10-2016-0041717), the duty cycle of a read enable signal RE is corrected in the latency period, and then the read enable signal RE and a data strobe signal DQS, duty cycles of which are corrected during the latency period, are outputted after the latency period.

However, the length of the latency period may be restricted according to how the memory device 150 is implemented, and even though the length of the latency period is not restricted, if the latency period is too long during a read operation, the performance of the memory system 110 may be degraded.

Therefore, according to the above conventional technique, the memory device 150 has to correct the duty cycle within only a few cycles after the read enable signal RE is driven. However, since an error may occur in the duty cycle correction due to the generation of power noise immediately after the read enable signal RE is driven and the duty cycle correction has to be completed within a short time, the accuracy may be poor, which is problematic.

According to an embodiment of the present invention, in response to an interface control signal from the controller 130, the interface device 512 may correct a duty cycle. Herein, the interface device 512 may deactivate the internal channel 532 to prevent the internal signal from being transferred to the memory device 150, and may correct the duty cycle by using a sufficiently long clock period as well as the latency interval. The reliability of the memory system 110 may be improved by increasing the accuracy of the duty cycle correction according to an embodiment of the present invention.

Figure 8:
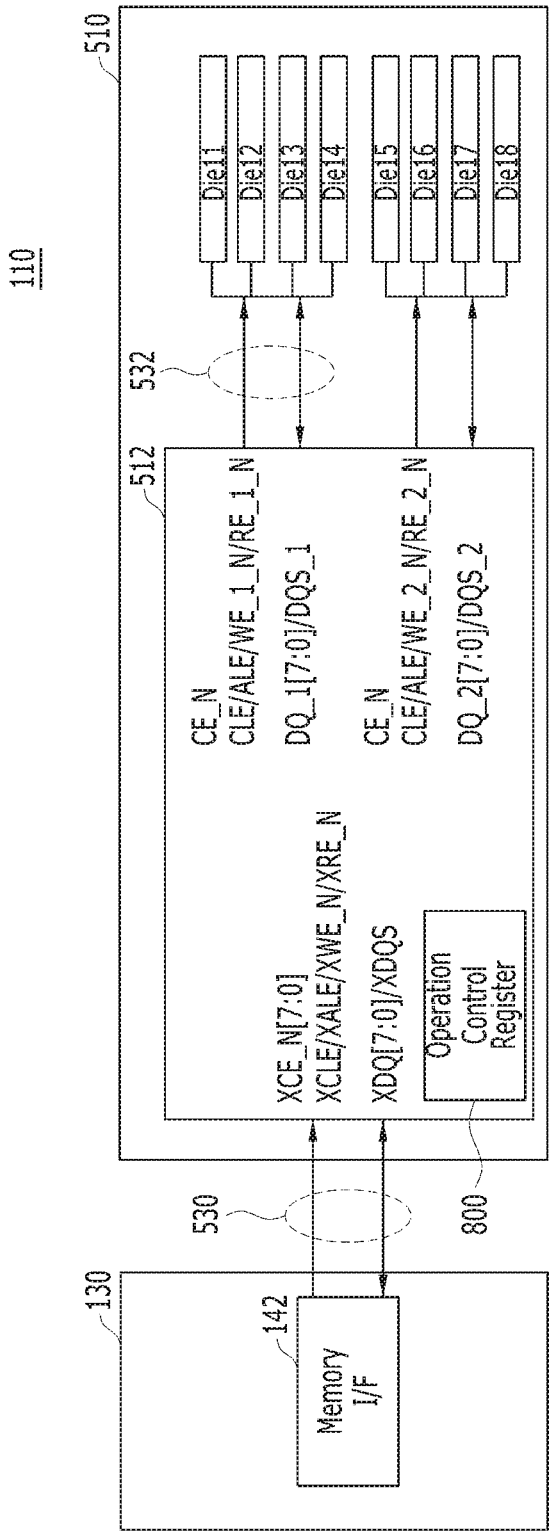
FIG. 8 is a block diagram illustrating a memory system in accordance with an embodiment of the present invention.

FIG. 8 is a block diagram illustrating the memory system 110 in accordance with an embodiment of the present invention.

According to the embodiment of the present invention, the interface device 512 may include an operation control register 800. The operation control register 800 may store information on whether the internal channel 532 is activated or not. The operation control register 800 may be, for example but not limited to, a 32-bit register.

Figure 9A:
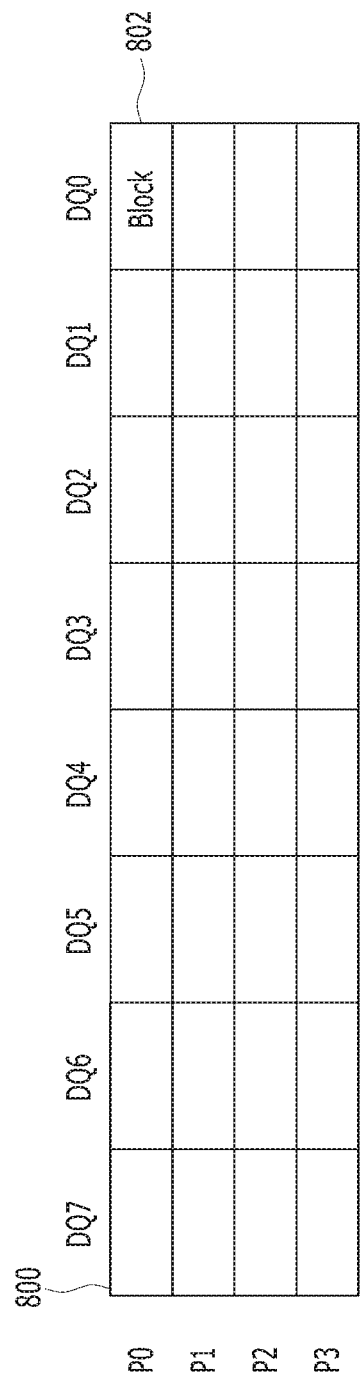
FIG. 9A exemplarily shows each bit of an operation control register of an interface device in accordance with the embodiment of the present invention.

FIG. 9A exemplarily shows each bit of the operation control register 800 of the interface device 512, when the operation control register 800 is assumed to be a 32-bit register, in accordance with the embodiment of the present invention.

The controller 130 may store the information on whether the internal channel 532 is activated or not by providing a set feature command to the interface device 512 and changing a value stored in the operation control register 800. The set feature command may refer to a command used when an operation of the memory device 150 is to be changed.

FIG. 9B is a timing diagram illustrating the set feature command, when the operation control register is assumed to be a 32-bit register, in accordance with the embodiment of the present invention.

In the example of FIG. 9B, the controller 130 may transfer a command, an address, and a 32-bit data through the data bus DQ[7:0]. The 32-bit data may be transferred through four-time transfer operations P0 to P3.

For example, in FIG. 9B, the controller 130 transfers a command EFh (denoted as "cmd"), and address XXh (denoted as "addr"), and 32-bits of data W-P0 to W-P3 (denoted as "data") through the data bus DQ[7:0]. The 32-bit data may be transferred through four-time transfer operations W-P0 to W-P3.

According to one embodiment of the present invention, at least one of the bits of the operation control register 800 may be designated as a blocking bit 802. In the example of FIG. 9A, the P0<0> bit, that is, the bit to be transferred first to the 32-bit register, may be designated as the blocking bit 802 (denoted as "Block"). The value transferred as the blocking bit 802 may be different according to whether the internal channel 532 is activated or not.

Although FIGS. 9A and 9B illustrate, as an example and for convenience of description, that the operation control register is a 32-bit register, it is to be noted that the present invention is not limited thereto. That is, the number of bits of the register may vary depending on design.

Figure 10:
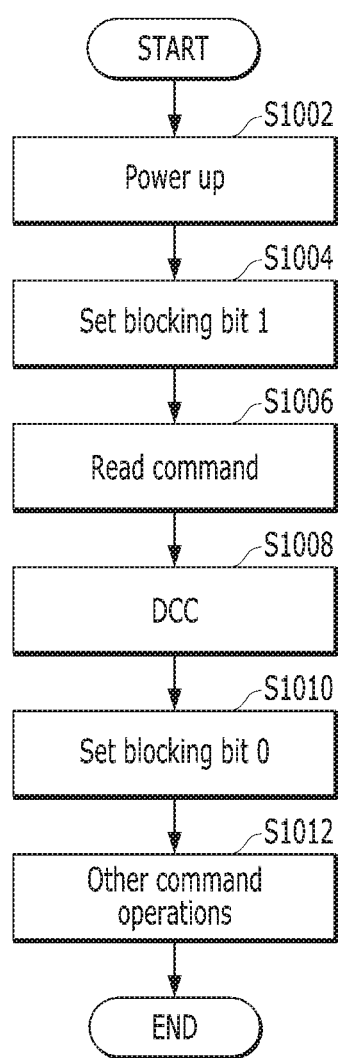
FIG. 10 is a flowchart describing an operation of the memory system in accordance with the embodiment of the present invention.

FIG. 10 is a flowchart describing an operation of the memory system 110 in accordance with the embodiment of the present invention.

When the memory system 110 is powered up (or turned on) in step S1002, the interface device 512 may correct the duty cycle of the clock by performing the operations of steps S1004 to S1010.

According to an embodiment of the present invention, the memory system 110 may include a plurality of interface devices 512, and each of the interface devices 512 may correct the duty cycle of the clock.

In step S1004, the controller 130 may transfer a command for setting the blocking bit 802 to a predetermined value, for example, '1', to the interface device 512 in order to deactivate the internal channel 532. The interface device 512 may set the blocking bit 802 to '1' in response to the command.

In step S1006, the controller 130 may provide a read command to the interface device 512. Referring to FIG. 8, since the external channel 530 is activated, the interface device 512 may receive the chip enable signal XCE_N[7:0], the command enable signal XCLE, the address enable signal XALE_N, and the read enable signal XRE_N from the controller 130 as control signals.

In response to the received signal, the interface device 512 may generate an internal chip enable signal CE_N, an internal command enable signal CLE, an internal address enable signal ALE_N, and an internal lead enable signal RE_N as internal signals.

The interface device 512 may check the value of the blocking bit 802 to determine whether to transfer the generated signals to the memory device 150. Since the value of the blocking bit 802 is set to '1' in the step S1004, the interface device 512 may not transfer the generated internal signals to the memory device 150 by deactivating the internal channel 532 accordingly.

According to an embodiment of the present invention, the interface device 512 may disable only the internal chip enable signal CE_N among the internal signals based on the value of the blocking bit 802. For example, the interface device 512 may disable the internal chip enable signal CE_N by keeping the internal chip enable signal CE_N having a logic high level, when the value of the blocking bit 802 is '1'. In this case, even if the remaining signals are transferred to the memory device 150, operations according to the signals are not actually performed in the memory device 150.

When a read command is received while the internal channel 532 is deactivated, the interface device 512 may correct the duty cycle based on the received signal in step S1008. The read command may be a command for generating a clock signal for duty cycle correction (DCC). In this present specification, this command may be referred to as a "correction command".

Hereafter, the operations of the steps S1004 to S1008 will be described in more detail with reference to FIGS. 11 and 12.

Figure 11:
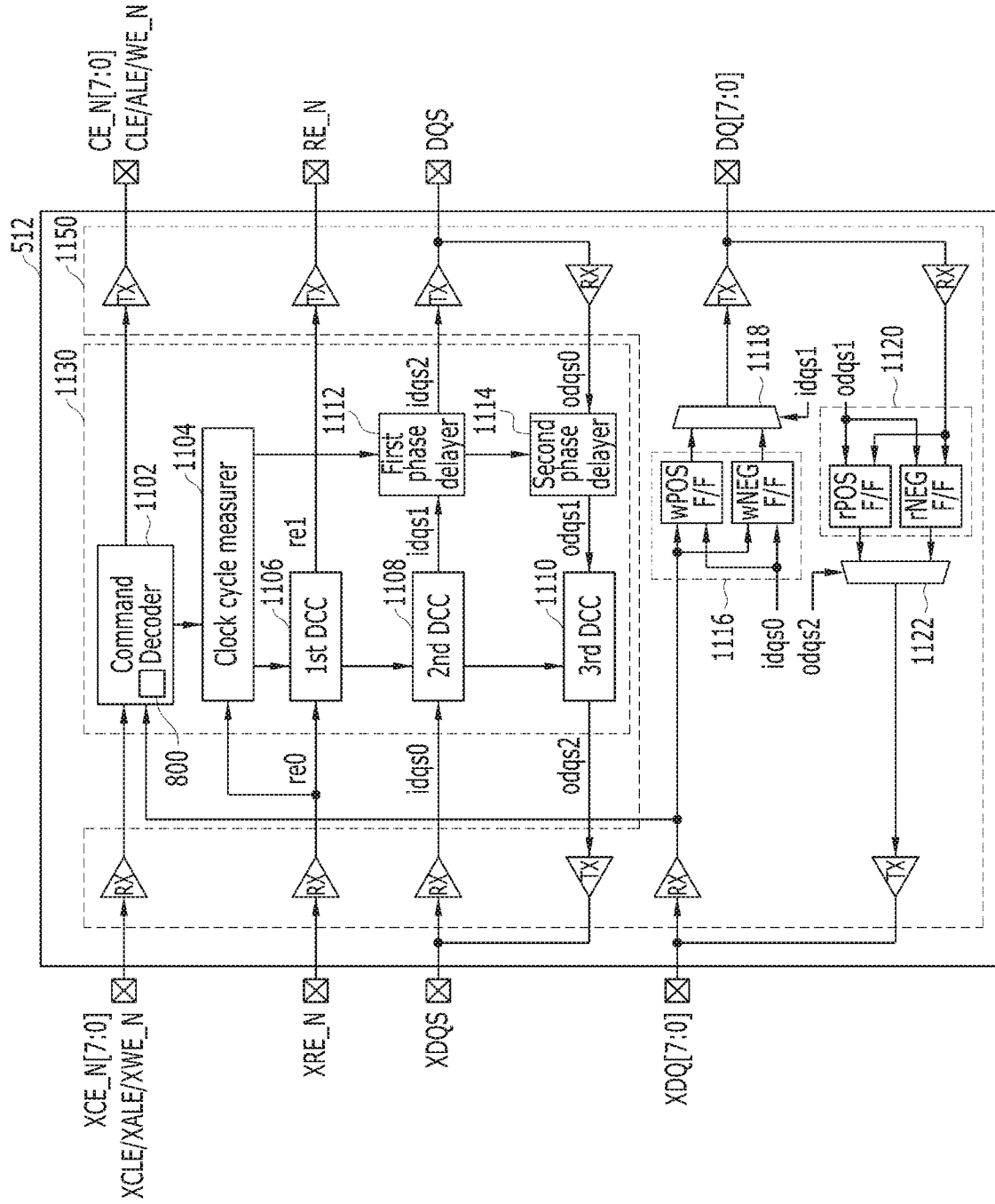
FIG. 11 is a schematic diagram illustrating a structure of the interface device in accordance with the embodiment of the present invention.

FIG. 11 is a schematic diagram illustrating a structure of the interface device 512 in accordance with the embodiment of the present invention.

The interface device 512 may include a signal control device 1130 and a signal transfer device 1150.

The signal transfer device 1150 may transfer the control signal from the controller to the memory device and transferring the data between the memory device and controller. The signal transfer device may include a first sampler 1116, a first multiplexer 1118, a second sampler 1120, a second multiplexer 1122, plural receiver (RX) and plural transmitter (TX).

The signal control device 1130 may control an operation of the signal transfer device in response to an interface control signal included in the control signal. The signal control device 1130 may include a command decoder 1102, a clock cycle measurer 1104, a first duty cycle correction circuit 1106, a second duty cycle correction circuit 1108, a third duty cycle correction circuit 1110, a first phase delayer 1112 and a second phase delayer 1114.

The command decoder 1102 may extract a command, an address, and a data from the control signals that are received from the controller 130 through the external channel 530. As a result of the extraction, when a command (e.g., P0<0>=1 b) for setting the value of the blocking bit 802 to, e.g. '1' in the operation control register 800 is received, the command decoder 1102 may set the value of the blocking bit 802 to '1'.

The interface device 512 may receive the read enable signal XRE from the controller 130, deactivate the internal channel 532 according to the value of the blocking bit 802 and measure the time corresponding to one clock cycle of the read enable signal XRE. The duty cycles of the internal read enable signal RE_N, the internal data strobe signal DQS, and the data strobe signal XDQS may be corrected based on the measured one cycle time of the read enable signal XRE.

The clock cycle measurer 1104 may measure and store the one cycle time of the read enable signal XRE.

Herein, the memory device 150 described with reference to FIG. 1 may perform a read operation by the unit of a page. For example, the memory device 150 may store approximately 8 KB or 16 KB of data on one page. When the memory system 110 receives one random read command and reads one page, the controller 130 may generate the read enable signal XRE approximately 4000 times or 8000 times.

According to an embodiment of the present invention, the interface device 512 may receive the read enable signal XRE thousands of times according to one read command, and may accurately measure one cycle time of the read enable signal XRE.

The clock cycle measurer 1104 may output a ½ cycle time and a ¼ cycle time based on the measured one cycle time and transfer them to first to third duty cycle correction (DCC) circuits 1106 to 1110.

Figure 12A:
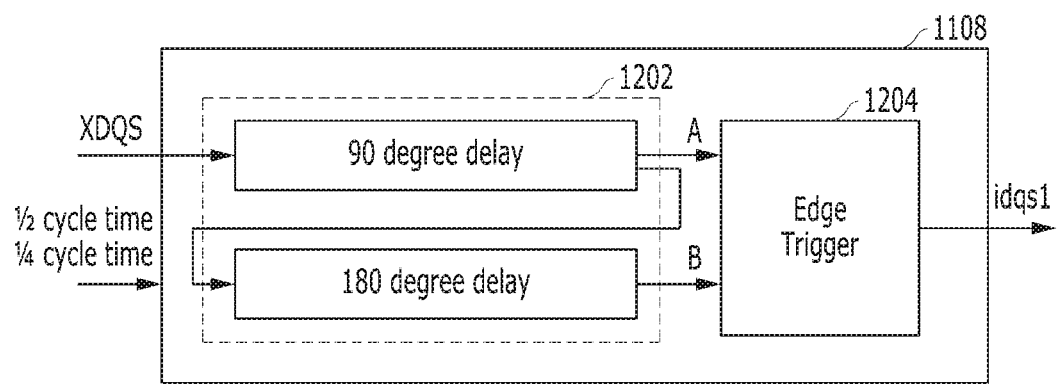
FIGS. 12A to 12D are block diagrams and timing diagrams illustrating a structure and an operation of a duty cycle correction circuit in accordance with the embodiment of the present invention.

FIG. 12A is a block diagram illustrating a structure of a second duty cycle correction circuit 1108 included in the interface device 512 in accordance with the embodiment of the present invention. In describing the structure and the operating method of the second duty cycle correction circuit 1108, references will be made to FIG. 11.

The second duty cycle correction circuit 1108 may receive the data strobe signal XDQS from the controller 130 and receive the ½ cycle time and the ¼ cycle time from the dock cycle measurer 1104. A phase converter 1202 may convert the phase of the data strobe signal XDQS.

Figure 12B:
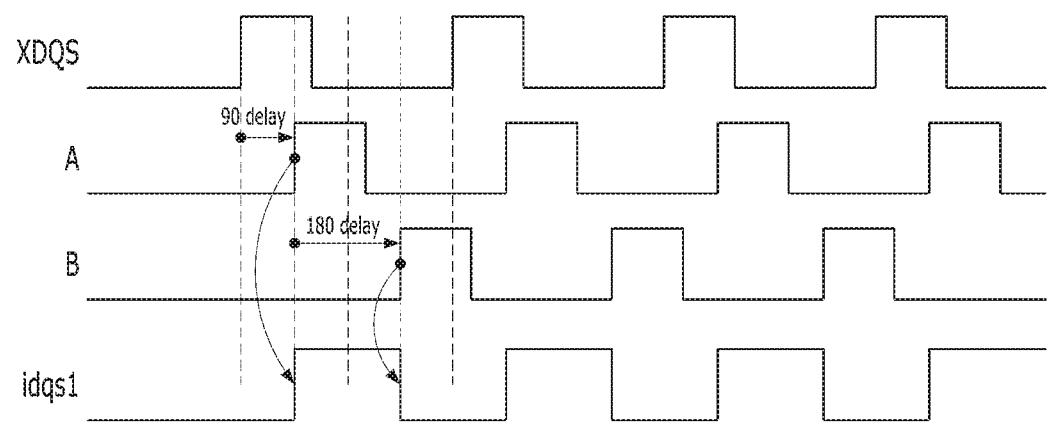

FIG. 12B is a timing diagram illustrating an operation of the second duty cycle correction circuit 1108.

The phase converter 1202 may generate a signal A by delaying the phase of the data strobe signal XDQS by 90 degrees based on the ¼ cycle time, and generate a signal B by delaying the signal A by 180 degrees based on the ½ cycle signal.

The edge trigger 1204 may receive the signal A and the signal B and output a signal idqs1 in a logic high level at a rising edge of the signal A, and output the signal idqs1 in a logic low level at a rising edge of the signal B. As a result, the signal idqs1 which has a duty cycle of approximately 50% and which has a phase lag of approximately 90 degrees behind the phase of the strobe signal XDQS may be generated.

Referring back to FIG. 11, the first phase delayer 1112 may generate a signal idqs2 by delaying the phase of the signal idqs1 by approximately 90 degrees. When the internal channel 532 is activated, the generated signal idqs2 may be outputted to the memory device 150 as the internal data strobe signal DQS.

Figure 12C:
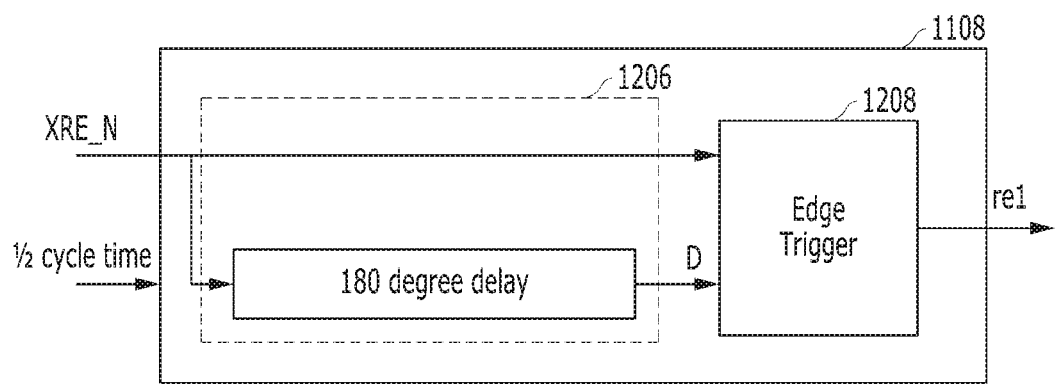

FIG. 12C is a block diagram illustrating a structure of the first duty cycle correction circuit 1106 included in the interface device 512 in accordance with the embodiment of the present invention.

The first duty cycle correction circuit 1106 may receive the read enable signal XRE_N from the controller and receive the ½ cycle time from the clock cycle measurer 1104. A phase converter 1206 may convert the phase of the read enable signal XRE_N.

Figure 12D:
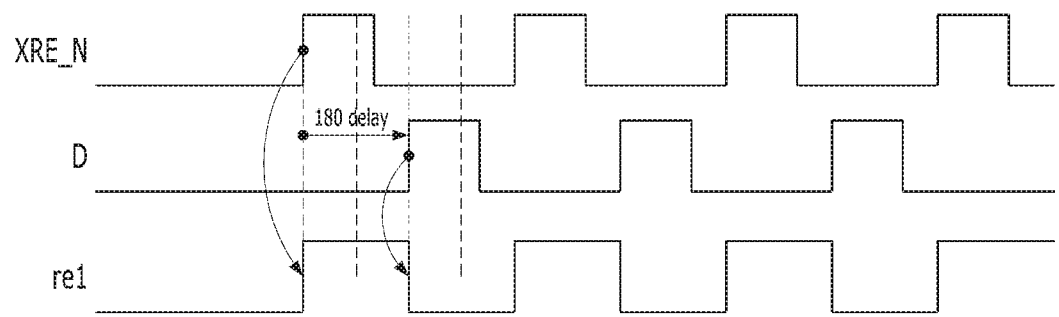

FIG. 12D is a timing diagram illustrating an operation of the first duty cycle correction circuit 1106.

The phase converter 1206 may generate a signal D by delaying the phase of the read enable signal XRE_N. The edge trigger 1208 may receive the read enable signal XRE_N and the signal D and output a signal re1 in a logic high level at a rising edge of the read enable signal XRE_N, and output the signal re1 in a logic low level at a rising edge of the signal D.

As a result, the first duty cycle correction circuit 1106 may generate a signal which has a duty cycle of approximately 50% and has no phase difference from the read enable signal XRE based on the read enable signal XRE and the ½ cycle time.

When the internal channel 532 is activated, the generated signal may be outputted to the memory device 150 as the internal read enable signal RE_N.

The configuration of the third duty cycle correction circuit 1110 may be substantially same to the second duty cycle correction circuit 1108. Similar to the second duty cycle correction circuit 1108, the third duty cycle correction circuit 1110 may generate a signal which has a duty cycle of approximately 50% and has a phase 90 degrees which lags behind the phase of a signal odqs1 based on the signal odqs1 which has a phase that is delayed from the internal data strobe signal DQS and the ½ cycle time and the ¼ cycle time. When the internal channel 532 is activated, the generated signal may be outputted to the controller 130 as the data strobe signal XDQS.

Although the example in FIGS. 11 and 12 shows a method in which the interface device 512 receives the read command and the read enable signal XRE as correction commands and performs the duty cycle correction is described with reference to FIG. 11, the present invention is not limited thereto. According to an embodiment of the present invention, the interface device 512 may receive a write command as a correction command and, in response to the write command, perform duty cycle correction based on the data strobe signal XDQS which is generated by the interface device 512.

Referring back to FIG. 10, when the duty cycle correction is completed in the step S1008, the controller 130 may transfer a command for setting the blocking bit 802 to a predetermined number, for example, '0' to the interface device 512 in step S1010. The interface device 512 may set the blocking bit 802 to 0 in response to the command.

In step S1012, the controller 130 may transfer an external command to the interface device 512. The interface device 512 may receive an external signal according to the external command. The interface device 512 may generate an internal signal in response to the received signal.

The interface device 512 may check the value of the blocking bit 802 to determine whether to provide the generated signal to the memory device 150 or not. Since the value of the blocking bit 802 is set to '0' in step S1010, the interface device 512 may accordingly transfer the generated signal to the memory device 150 by activating the internal channel 532. Thus, the memory device 150 may perform other operations in response to the commands transferred from the host 102 or the controller 130.

The interface device 512 may perform communication between the controller 130 and the memory device 150 as described with reference to FIGS. 6 and 7. Herein, data input/output operations may be performed based on the internal read enable signal RE_N which has a duty cycle that is corrected and the internal data strobe signal DQS which is generated based on the internal read enable signal RE_N, the duty cycle of which is corrected, and has a duty cycle of approximately 50%.

The method of changing the value of the blocking bit 802 to activate or deactivate the internal channel 532 is not limited to transferring the command, the address, and the 32-bit data as described above. According to an embodiment of the present invention, the interface device 512 may receive only a command and an address from the controller 130, and change the value of the blocking bit 802 only by accessing the blocking bit 802.

According to an embodiment of the present invention, the interface device 512 may receive only a blocking command and an unblocking command, and change the value of the blocking bit 802.

According to various embodiments of the invention described above, the interface device 512 may deactivate the internal channel 532 such that an operation according to a command is not performed in the memory device 150 but the interface device 512 performs a duty cycle correction based on a sufficient clock cycle according to the command. The reliability of the memory system 110 may be improved by performing a data input/output operation based on a clock which has a duty cycle that is more accurately corrected than the case where the duty cycle is corrected in the latency period, which is described in FIG. 7.

Figure 13A:
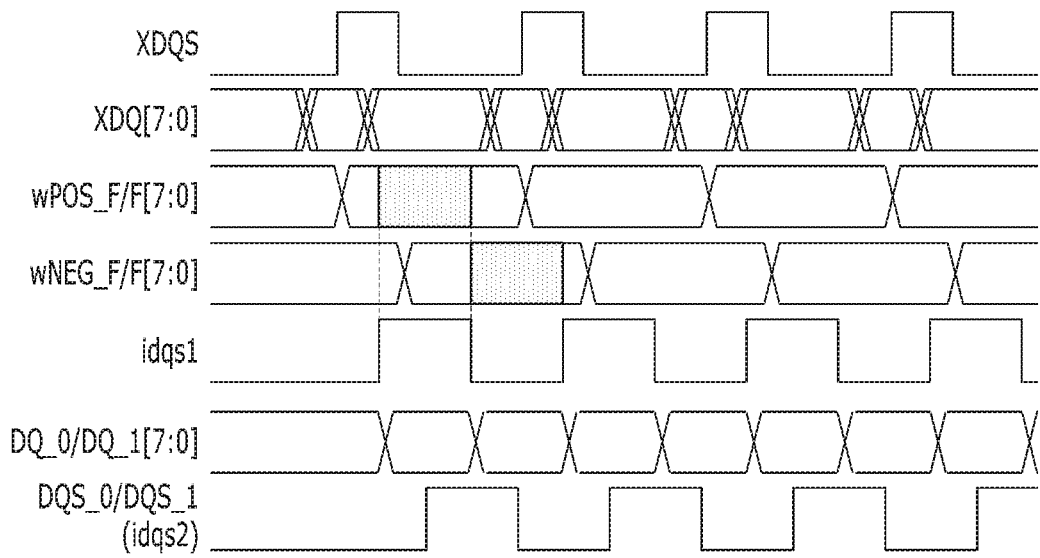
FIGS. 13A and 13B are timing diagrams illustrating an operation of the memory system based on a corrected clock in accordance with the embodiment of the present invention.

FIG. 13A is a timing diagram illustrating a write operation of the memory system 110 based on the corrected clock in accordance with the embodiment of the present invention.

Referring to FIG. 13A, in response to a write command transferred from the host 102, the controller 130 may transfer the data strobe signal XDQS and the data signal XDQ[7:0] according to which a write operation is to be performed to the interface device 512.

The first sampler 1116 of FIG. 11 may sample the data signal XDQ[7:0] at a rising edge and a falling edge of the external data strobe signal XDQS which has a duty cycle that is not corrected. The sampled signal may correspond to a wPOS_F/F signal and a wNEG_F/F signal of FIG. 13.

The signal idqs1 in FIG. 13 may be a signal which is generated by the second duty cycle correction circuit 1108, which has a duty cycle of approximately 50% and which has a phase that lags approximately 90 degrees behind the phase of the data strobe signal XDQS. The first multiplexer 1118 in FIG. 11 may generate a data signal DQ[7:0] with a wide data valid window by outputting either the signal wPOS_F/F or the signal wNEG_F/F according to the signal idqs1.

The first phase delayer 1112 may generate an signal idqs2 which has a phase that lags approximately 90 degrees behind the is phase of the signal idqs1 and output the signal idqs2 as an internal data strobe signal DQS. The interface device 512 may transfer the internal data signal DQ[7:0] and the internal data strobe signals DQS to the memory device 150.

Even though the interface device 512 receives from the controller 130 the data strobe signal XDQS and the data signal XDQ[7:0], duty cycles of which are not 50%, the reliability of the data written in the memory device 150 may be improved by transferring to the memory device 150 the internal data strobe signal DQS and the internal data signal DQ[7:0], duty cycles of which are 50%.

Figure 13B:
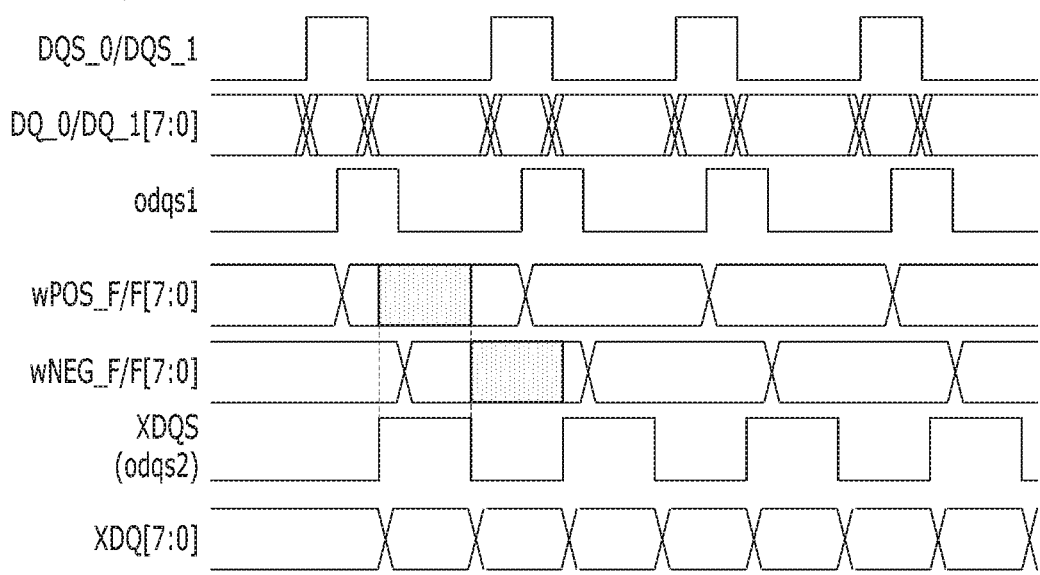

FIG. 13B is a timing diagram illustrating a read operation of the memory system 110 based on the corrected clock in accordance with the embodiment of the present invention.

Referring to FIG. 13B, after a read operation is performed in the memory device 150 in response to a read command from the host 102, the internal data strobe signal DQS and the internal data signal DQ[7:0] including the read data may be transferred to the interface device 512. Herein, the read enable signal RE may be modified in the memory device 150, and the duty cycle of the internal data strobe signal DQS which is generated based on the modified read enable signal may not be approximately 50%. The data valid window of the internal data signal DQ[7:0] which is sampled based on the internal data strobe signal DQS may not be constant.

The second phase delayer 1114 of FIG. 11 may modify the phase of the internal data strobe signal DQS to generate an signal odqs1. The signal odqs1 may be a signal which has a phase that lags approximately 90 degrees behind the phase of the internal data strobe signal DQS, or the signal odqs1 may be a signal which has a phase that is delicately tuned according to the sampling result. The second sampler 1120 may sample the internal data signal DQ[7:0] at a rising edge and a falling edge of the signal odqs1. The sampled signal may correspond to the signal wPOS_F/F and the signal wNEG_F/F in FIG. 12.

The signal odqs2 in FIG. 12 may be a signal which is generated by the third duty cycle correction circuit 1110 and which has a duty cycle of approximately 50% and a phase that lags approximately 90 degrees behind the phase of the signal odqs1. The second multiplexer 1122 in FIG. 11 may generate a data signal XDQ[7:0] with a wide data valid window by outputting either the signal wPOS_F/F or the signal wNEG_F/F based on the signal odqs2.

The interface device 512 may transfer the data signal XDQ[7:0] to the controller 130. The interface device 512 may transfer the signal odqs2 to the controller 130 as the data strobe signal XDQS.

Even though the internal read enable signal RE is modified in the memory device 150 so that the duty cycle is not approximately 50%, the reliability of the read data may be improved as the interface device 512 transfers the data strobe signal XDQS having the duty cycle of approximately 50% and the data signal XDQ[7:0] to the controller 130.

Hereafter, referring to FIGS. 14 to 22, a data processing system and electronic devices to which the memory system 110 including the memory device 150 and the controller 130 described with reference to FIGS. 1 to 13 in accordance with the embodiment of the present invention is applied, may be described in detail.

Figure 14:
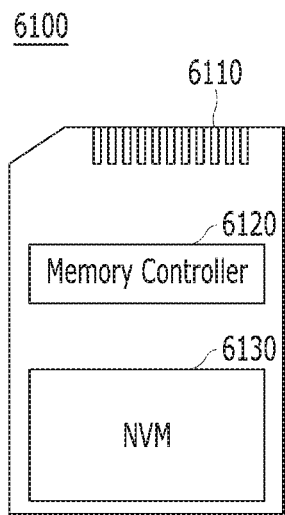
FIGS. 14 to 22 are diagrams schematically illustrating application examples of the data processing system in accordance with various embodiments of the present invention.

FIG. 14 is a diagram schematically illustrating the data processing system including the memory system in accordance with an embodiment. FIG. 14 schematically illustrates a memory card system to which the memory system in accordance with an embodiment is applied.

Referring to FIG. 14, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the is memory system 110 described with reference to FIG. 1, and the memory device 6130 may correspond to the memory device 150 of the memory system 110 described with reference to FIG. 1.

Thus, the memory controller 6120 may include a RAM, a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may form a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 15:
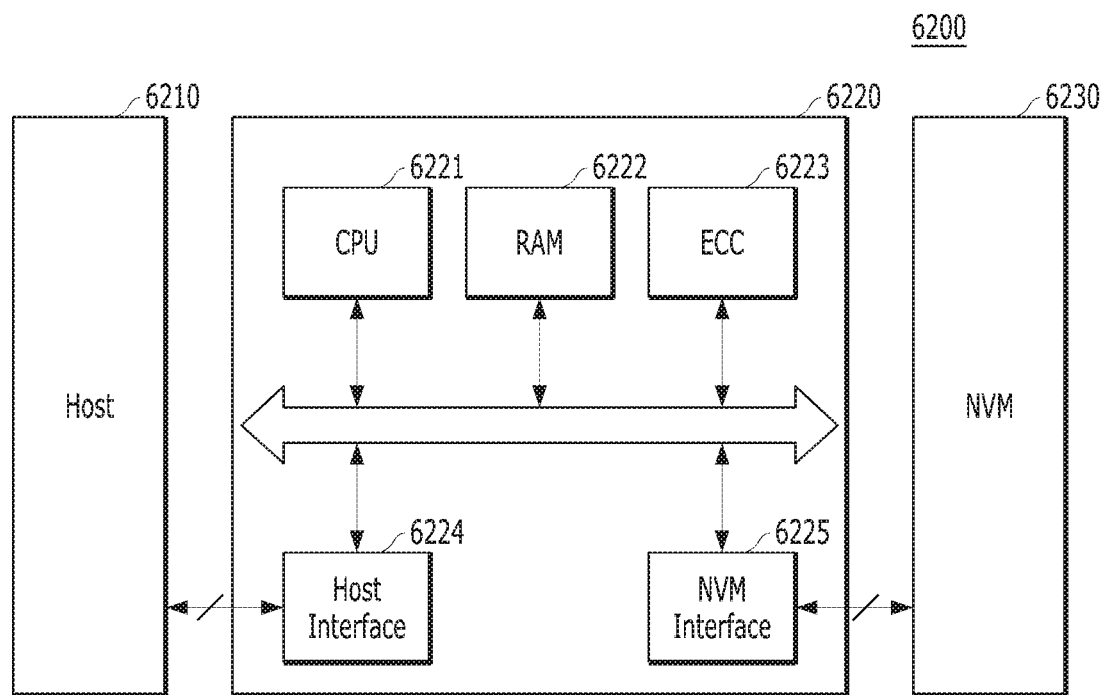

FIG. 15 is a diagram schematically illustrating another example of the data processing system including the memory system in accordance with an embodiment.

Referring to FIG. 15, the data processing system 6200 may include a memory device 6230 having one or more nonvolatile memories and a memory controller 6220 for controlling the memory device 6230. The data processing system 6200 illustrated in FIG. 15 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 16:
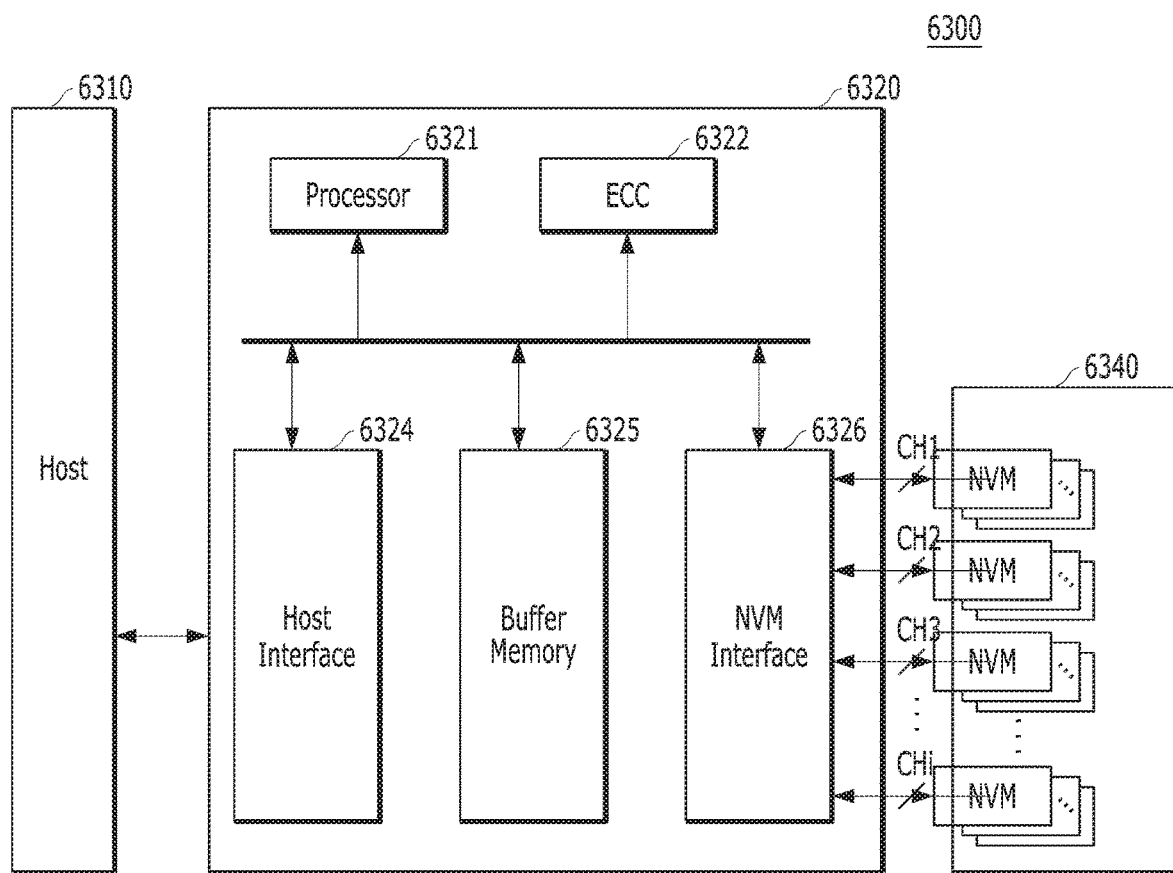

FIG. 16 is a diagram schematically illustrating another example of the data processing system including the memory system in accordance with an embodiment. FIG. 16 schematically illustrates an SSD to which the memory system may be applied.

Referring to FIG. 16, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 16 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 17:
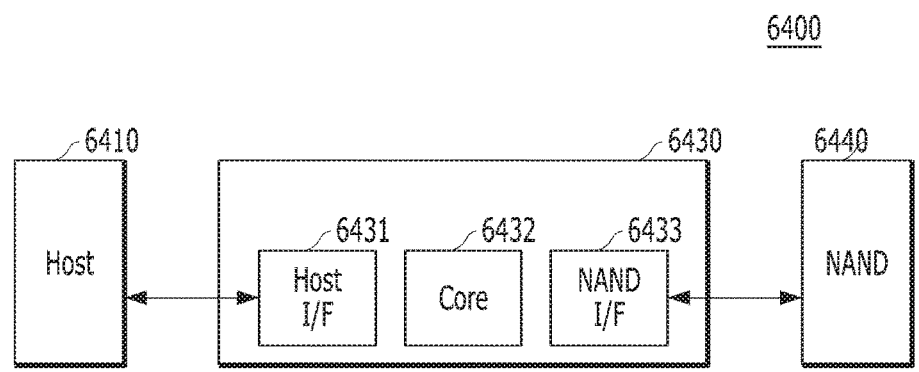

FIG. 17 is a diagram schematically illustrating another example of the data processing system including the memory system in accordance with an embodiment. FIG. 17 schematically illustrates an embedded Multi-Media Card (eMMC) to which the memory system may be applied.

Referring to FIG. 17, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 18 to 21 are diagrams schematically illustrating other examples of the data processing system including the memory system in accordance with one or more embodiments. FIGS. 18 to 21 schematically illustrate UFS (Universal Flash Storage) systems to which the memory system may be applied.

Referring to FIGS. 18 to 21, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card system 6100 described with reference to FIG. 14.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630,

6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 18:
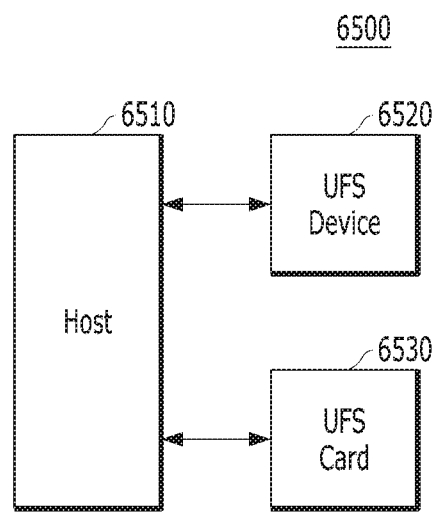

In the UFS system 6500 illustrated in FIG. 18, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. At this time, the UFS device 6520 and the UFS card 6530 may communicate with each other through link layer switching at the UniPro of the host 6510. In an embodiment, the configuration in which one UFS device 6520 and one UFS card 6530 are connected to the host 6410 has been exemplified for convenience of description. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 19:
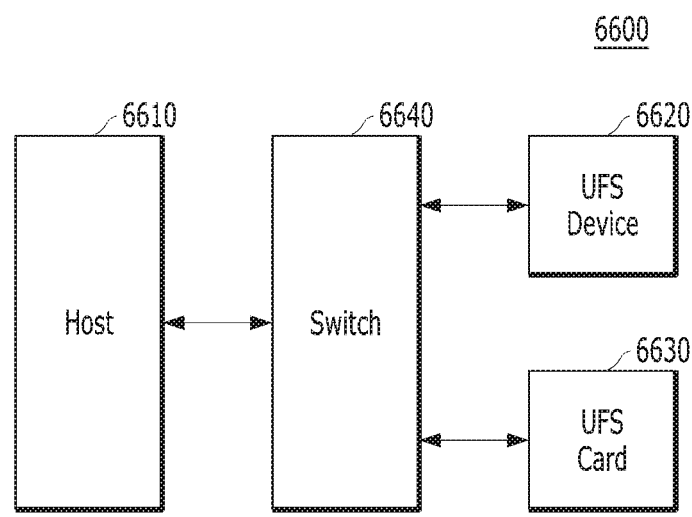

In the UFS system 6600 illustrated in FIG. 19, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In an embodiment, the configuration in which one UFS device 6620 and one UFS card 6630 are connected to the switching module 6640 has been exemplified for convenience of description. However, a plurality of UFS devices and UFS cards may be connected in parallel or in the form of a star to the switching module 6640, and a plurality of UFS cards may be connected in series or in the form of a chain to the UFS device 6620.

Figure 20:
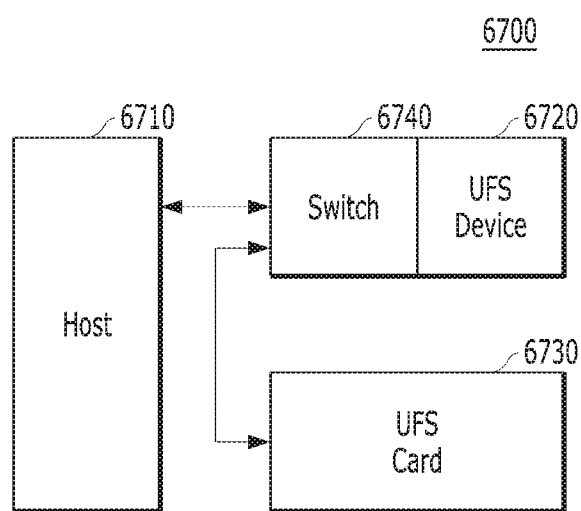

In the UFS system 6700 illustrated in FIG. 20, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. At this time, the UFS device 6720 and the UFS card 6730 may communicate with each other through link layer switching of the switching module 6740 at the UniPro, and the switching module 6740 may be integrated as one module with the UFS device 6720 inside or outside the UFS device 6720. In an embodiment, the configuration in which one UFS device 6720 and one UFS card 6730 are connected to the switching module 6740 has been exemplified for convenience of description. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 21:
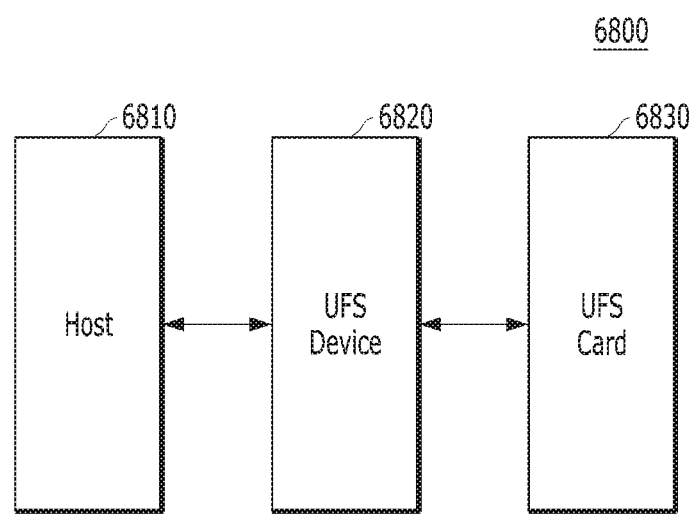

In the UFS system 6800 illustrated in FIG. 21, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. At this time, the host 6810 and the UFS card 6830 may communicate with each other through target ID switching between the M-PHY and UniPro modules of the UFS device 6820. In an embodiment, the configuration in which one UFS device 6820 is connected to the host 6810 and one UFS card 6830 is connected to the UFS device 6820 has been exemplified for convenience of description. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 22:
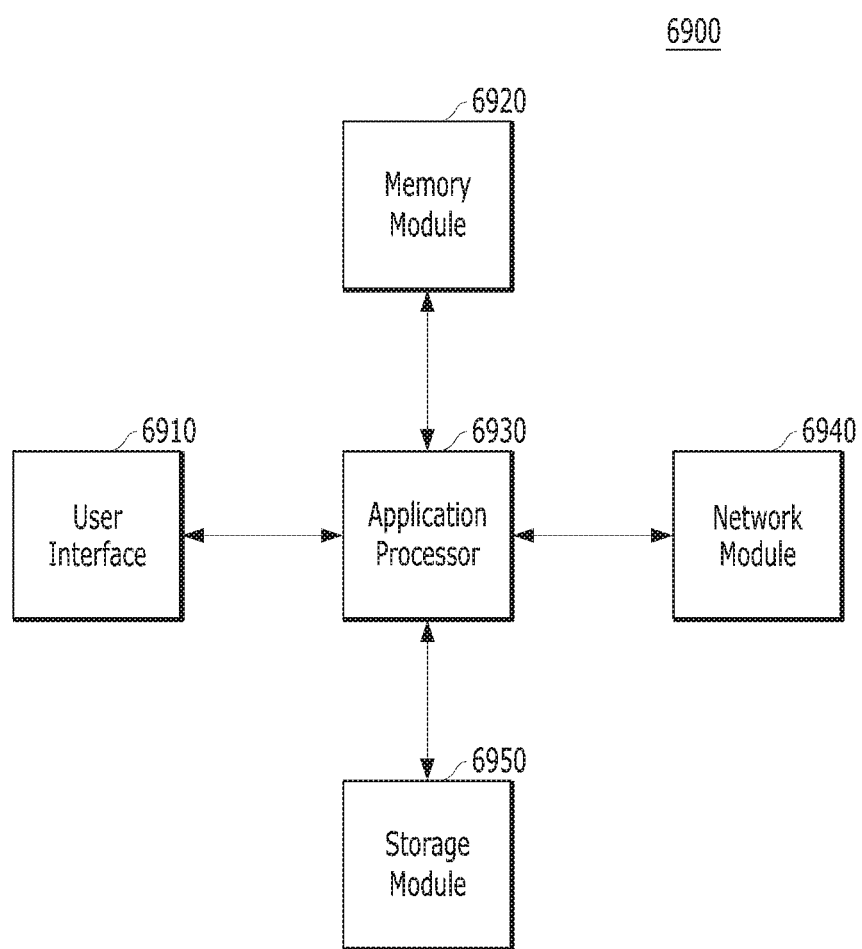

FIG. 22 is a diagram schematically illustrating another example of the data processing system including the memory system is in accordance with an embodiment. FIG. 22 is a diagram schematically illustrating a user system to which the memory system may be applied.

Referring to FIG. 22, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 16 to 21.

The user interface 6910 may include interfaces for inputting data or commands to the application processor 6930 or outputting data to an external device. For example, the user interface 6910 is may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to the embodiments of the present invention, the memory system may have improved reliability by accurately correcting a clock of the memory system, and a method of operating the memory system.

While the present invention has been described with respect to the specific embodiments, it will be apparent to those skilled in the art that various changes and modifications may be made without departing from the spirit and scope of the invention as defined in the following claims.

What is claimed is:

1. A memory system, comprising:
a memory device suitable for storing a data;
a controller suitable for controlling an operation of the memory device based on a control signal; and
an interface device including:
a signal transfer device suitable for transferring the control signal from the controller to the memory device and transferring the data between the memory device and the controller; and
a signal control device suitable for controlling an operation of the signal transfer device in response to an interface control signal included in the control signal,
wherein the interface control signal includes a blocking command for stopping an operation of the signal transfer device, a correction command for correcting a duty cycle of the control signal, and an unblocking command for resuming the operation in response to the corrected control signal, of the signal transfer device.

2. The memory system of claim 1, wherein the blocking command and the unblocking command are set feature commands.

3. The memory system of claim 1, wherein the signal control device includes an operation control register suitable for storing a value indicating whether the signal transfer device operates or not.

4. The memory system of claim 3, wherein the controller controls the operation of the signal transfer device by changing the stored value of the operation control register based on the interface control signal.

5. The memory system of claim 1, wherein the signal control device deactivates an access to the memory device in response to the blocking command.

6. The memory system of claim 5, wherein the signal control device deactivates a chip enable signal for the memory device in response to the blocking command.

7. The memory system of claim 5, wherein the signal control device measures one cycle time of a clock signal of the controller in response to the correction command, and calculates a ½ cycle time and a ¼ cycle time of the clock signal based on the measured one cycle time.

8. The memory system of claim 7, wherein the signal control device generates a first signal and a second signal which have waveforms that are the same as a waveform of the clock signal and which have phases that are 180 degrees different from each other based on at least one between the ½ cycle time and the ¼ cycle time and the clock signal.

9. The memory system of claim 8, wherein the signal control device corrects the duty cycle by outputting a logic high level at a rising edge of the first signal and outputting a logic low level at a rising edge of the second signal.

10. The memory system of claim 7, wherein the controller provides a read command as the correction command for correcting the duty cycle and provides a read enable signal as the clock signal.

11. A memory system, comprising:
a memory device suitable for storing a data;
a controller suitable for controlling an operation of the memory device based on a control signal; and
an interface device including:
a signal transfer device suitable for transferring the control signal from the controller to the memory device and transferring the data between the memory device and the controller; and
a signal control device suitable for controlling an operation of the signal transfer device in response to an interface control signal included in the control signal,
wherein the interface control signal includes a blocking command, a correction command, and an unblocking command, and
wherein the signal control device stops the operation of the signal transfer device in response to the blocking command, corrects a duty cycle of the control signal in response to the correction command, and resumes the operation in response to the corrected control signal, of the signal transfer device in response to the unblocking command.

12. The memory system of claim 11, wherein the blocking command and the unblocking command are set feature commands.

13. The memory system of claim 11, wherein the signal control device includes an operation control register suitable for storing a value indicating whether the signal transfer device operates or not.

14. The memory system of claim 11, wherein the controller controls the operation of the signal transfer device by changing the stored value of the operation control register based on the interface control signal.

15. The memory system of claim 11, wherein the signal control device deactivates an access to the memory device in response to the blocking command.

16. The memory system of claim 15, wherein the signal control device deactivates a chip enable signal for the memory device in response to the blocking command.

17. The memory system of claim 11, wherein the signal control device measures one cycle time of a clock signal of the controller in response to the correction command, and calculates a ½ cycle time and a ¼ cycle time of the clock signal based on the measured one cycle time.

18. The memory system of claim 17,
wherein the signal control device generates a first signal and a second signal which have waveforms that are the same as a waveform of the clock signal and which have phases that are 180 degrees different from each other based on at least one between the ½ cycle time and the ¼ cycle time and the clock signal, and
wherein the signal control device corrects the duty cycle by outputting a logic high level at a rising edge of the first signal and outputting a logic low level at a rising edge of the second signal.

19. The memory system of claim 17, wherein the controller provides a read command as the correction command for correcting the duty cycle and provides a read enable signal as the clock signal.

20. A memory system comprising:
a controller suitable for providing a blocking command, a read command and an unblocking command and data;
an interface device suitable for:
generating operation signals;
deactivating a channel coupled thereto in response to the blocking command;
correcting a duty cycle of the operation signals in response to the read command provided after the blocking command, using an operation signal associated with the read command; and
activating the channel and providing the corrected operation signals and the data through the channel in response to the unblocking command; and
a memory device coupled to the channel and suitable for performing an operation in response to the corrected operation signals and the data.

* * * * *